US011289346B2

(12) United States Patent
Huang et al.

(10) Patent No.: US 11,289,346 B2
(45) Date of Patent: Mar. 29, 2022

(54) METHOD FOR FABRICATING ELECTRONIC PACKAGE

(71) Applicant: Siliconware Precision Industries Co., Ltd., Taichung (TW)

(72) Inventors: Chen-Yu Huang, Taichung (TW); Chee-Key Chung, Taichung (TW); Chang-Fu Lin, Taichung (TW); Kong-Toon Ng, Taichung (TW); Rui-Feng Tai, Taichung (TW); Bo-Hao Ma, Taichung (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 0 days.

(21) Appl. No.: 16/919,433

(22) Filed: Jul. 2, 2020

(65) Prior Publication Data
US 2020/0335447 A1    Oct. 22, 2020

Related U.S. Application Data

(62) Division of application No. 15/971,534, filed on May 4, 2018, now Pat. No. 10,741,500.

(30) Foreign Application Priority Data

Jan. 30, 2018   (TW) ................................ 107103221

(51) Int. Cl.
*H01L 21/44*     (2006.01)
*H01L 21/56*     (2006.01)
(Continued)

(52) U.S. Cl.
CPC ...... *H01L 21/563* (2013.01); *H01L 21/31051* (2013.01); *H01L 21/4853* (2013.01);
(Continued)

(58) Field of Classification Search
CPC . H01L 21/568; H01L 21/6835; H01L 21/561; H01L 21/4853; H01L 21/56; H01L 21/563; H01L 21/31051; H01L 21/4825; H01L 21/4875; H01L 21/82; H01L 23/5389; H01L 23/3114; H01L 23/3128; H01L 23/481; H01L 23/5226; H01L 23/5383; H01L 24/06; H01L 24/14; H01L 24/19; H01L 24/20; H01L 25/0652; H01L 25/0657; H01L 25/16; H01L 24/13; H01L 2224/1134; H01L 2224/13101;
(Continued)

(56) References Cited

U.S. PATENT DOCUMENTS

9,780,074 B2    10/2017  Kim et al.
10,026,716 B2    7/2018  Yu et al.
(Continued)

*Primary Examiner* — Shouxiang Hu
(74) *Attorney, Agent, or Firm* — Mintz Levin Cohn Feris Glovsky and Popeo, P.C.; Peter F. Corless (57) ABSTRACT

An electronic package and a method for fabricating the same are provided. The method includes: forming a circuit structure on an encapsulant; embedding a first electronic component and a plurality of conductive posts in the encapsulant; and disposing a second electronic component on the circuit structure. Since the first and second electronic components are arranged on opposite sides of the circuit structure, the electronic package can provide multi-function and high efficiency.

9 Claims, 7 Drawing Sheets

(51) Int. Cl.

| | | |
|---|---|---|
| *H01L 23/31* | (2006.01) | |
| *H01L 23/522* | (2006.01) | |
| *H01L 25/065* | (2006.01) | |
| *H01L 23/00* | (2006.01) | |
| *H01L 25/16* | (2006.01) | |
| *H01L 23/48* | (2006.01) | |
| *H01L 23/538* | (2006.01) | |
| *H01L 21/48* | (2006.01) | |
| *H01L 21/683* | (2006.01) | |
| *H01L 21/3105* | (2006.01) | |

(52) U.S. Cl.
CPC .............. *H01L 21/56* (2013.01); *H01L 21/561* (2013.01); *H01L 21/568* (2013.01); *H01L 21/6835* (2013.01); *H01L 23/3114* (2013.01); *H01L 23/3128* (2013.01); *H01L 23/481* (2013.01); *H01L 23/5226* (2013.01); *H01L 23/5383* (2013.01); *H01L 23/5389* (2013.01); *H01L 24/06* (2013.01); *H01L 24/14* (2013.01); *H01L 24/19* (2013.01); *H01L 24/20* (2013.01); *H01L 25/0652* (2013.01); *H01L 25/0657* (2013.01); *H01L 25/16* (2013.01); *H01L 24/13* (2013.01); *H01L 2224/1134* (2013.01); *H01L 2224/13101* (2013.01); *H01L 2224/13147* (2013.01); *H01L 2224/16225* (2013.01); *H01L 2224/18* (2013.01); *H01L 2224/32225* (2013.01); *H01L 2224/73204* (2013.01); *H01L 2224/73267* (2013.01); *H01L 2224/81385* (2013.01); *H01L 2924/181* (2013.01); *H01L 2924/18161* (2013.01)

(58) Field of Classification Search
CPC ........... H01L 2224/13147; H01L 24/16; H01L 24/32; H01L 24/73; H01L 23/49816; H01L 23/49838
See application file for complete search history.

(56) References Cited

U.S. PATENT DOCUMENTS

| | | | |
|---|---|---|---|
| 10,269,773 B1* | 4/2019 | Yu | ............................. H01L 21/56 |
| 10,475,747 B2* | 11/2019 | Yu | ............................. H01L 24/20 |
| 2012/0211885 A1 | 8/2012 | Choi et al. | |
| 2016/0013172 A1 | 1/2016 | Lin et al. | |
| 2016/0372432 A1* | 12/2016 | Tan | ........................... H01L 24/24 |
| 2018/0076179 A1 | 3/2018 | Hsu et al. | |
| 2018/0277485 A1* | 9/2018 | Han | ...................... H01L 23/5389 |

* cited by examiner

METHOD FOR FABRICATING ELECTRONIC PACKAGE

CROSS-REFERENCE TO RELATED APPLICATION(S)

This application is a divisional of copending application U.S. Ser. No. 15/971,534, filed on May 4, 2018, which claims under 35 U.S.C. § 119(a) the benefit of Taiwanese Application No. 107103221, filed on Jan. 30, 2018, the entire contents of which are incorporated herein by reference.

BACKGROUND

1. Technical Field

The present disclosure relates to packaging processes, and, more particularly, to an electronic package having a plurality of chips and a method for fabricating the electronic package.

2. Description of Related Art

Along with the rapid development of electronic industries, electronic products are developed toward the trend of multi-function and high performance. Accordingly, wafer level packaging (WLP) technologies have been developed to meet the miniaturization requirement of electronic packages.

FIGS. 1A to 1E are schematic cross-sectional views showing a method for fabricating a semiconductor package 1 using WLP technologies according to the prior art.

Figure 1A:
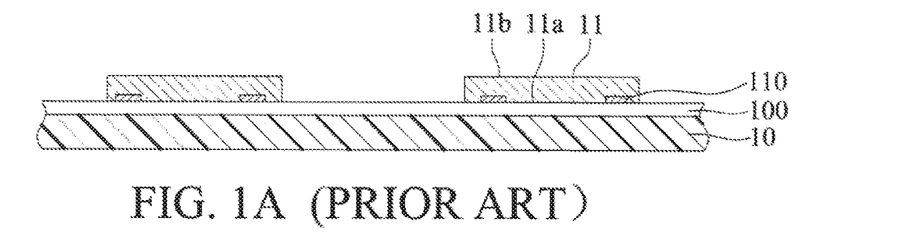
FIGS. 1A to 1E are schematic cross-sectional views showing a method for fabricating a semiconductor package according to the prior art.

Referring to FIG. 1A, a thermal release tape 100 is formed on a carrier 10.

Then, a plurality of semiconductor elements 11 are disposed on the thermal release tape 100. Each of the semiconductor elements 11 has an active surface 11a with a plurality of electrode pads 110 disposed thereon and an inactive surface 11b opposite to the active surface 11a. The semiconductor elements 11 are attached to the thermal release tape 100 via the active surfaces 11a thereof.

Figure 1B:
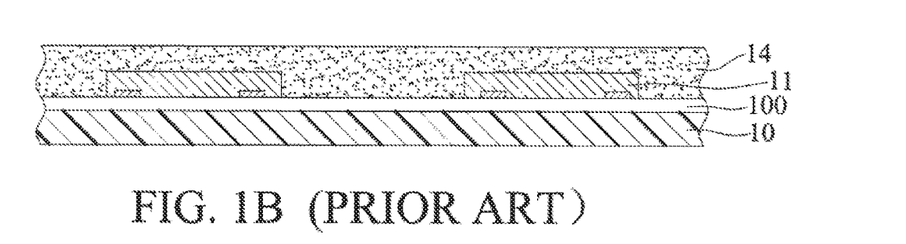

Referring to FIG. 1B, an encapsulant 14 is formed on the thermal release tape 100 to encapsulate the semiconductor elements 11.

Figure 1C:
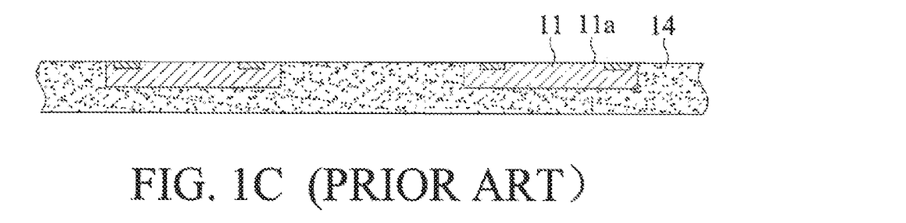

Referring to FIG. 1C, a baking process is performed to cure the thermal release tape 100. As such, the thermal release tape 100 and the carrier 10 are removed to expose the active surfaces 11a of the semiconductor elements 11.

Figure 1D:
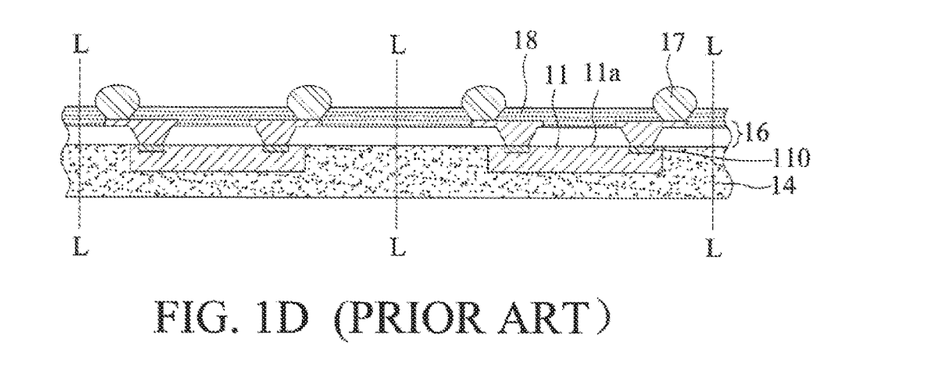

Referring to FIG. 1D, a circuit structure 16 is formed on the encapsulant 14 and the active surfaces 11a of the semiconductor elements 11 and electrically connected to the electrode pads 110 of the semiconductor elements 11. Then, an insulating layer 18 is formed on the circuit structure 16. A portion of the surface of the circuit structure 16 is exposed from the insulating layer 18 so as for a plurality of conductive elements 17, such as solder balls, to be mounted thereon.

Figure 1E:
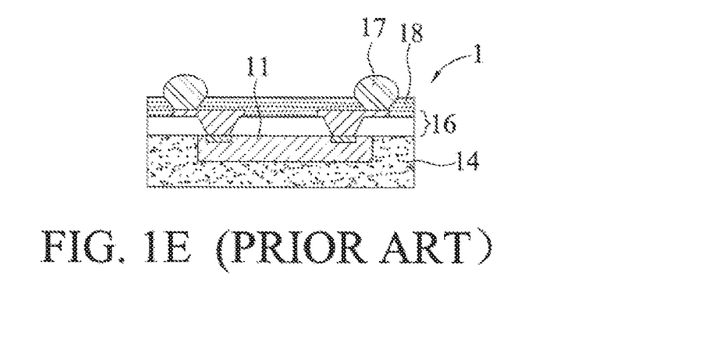

Referring to FIG. 1E, a singulation process is performed along cutting paths L of FIG. 1D. As such, a plurality of semiconductor packages 1 are obtained.

However, since the semiconductor elements 11 are disposed on a single side of the circuit structure 16, the function and efficiency of the semiconductor packages 1 are limited. Therefore, the function and efficiency of the end electronic products are limited.

Therefore, how to overcome the above-described drawbacks has become critical.

SUMMARY

In view of the above-described drawbacks, the present disclosure provides an electronic package, which comprises: a first encapsulant having a first surface and a second surface opposite to the first surface; a first electronic component embedded in the first encapsulant; a plurality of conductive posts embedded in the first encapsulant; a first circuit structure disposed on the first surface of the first encapsulant and electrically connected to the conductive posts; a plurality of first conductive elements disposed on the first circuit structure; a second circuit structure disposed on the second surface of the first encapsulant and electrically connected to the conductive posts and the first electronic component; and a second electronic component disposed on and electrically connected to the second circuit structure.

The present disclosure further provides a method for fabricating an electronic package, which comprises: providing a first encapsulant having a first surface and a second surface opposite to the first surface and embedding a first electronic component and a plurality of conductive posts in the first encapsulant; disposing a first circuit structure on the first surface of the first encapsulant and electrically connecting the first circuit structure to the conductive posts; disposing a plurality of first conductive elements on the first circuit structure; disposing a second circuit structure on the second surface of the first encapsulant and electrically connecting the second circuit structure to the conductive posts and the first electronic component; and disposing a second electronic component on the second circuit structure and electrically connecting the second electronic component to the second circuit structure.

In an embodiment, end surfaces of the conductive posts are flush with at least one of the first surface and the second surface of the first encapsulant. In another embodiment, end surfaces of the conductive posts are flush with the first surface or the second surface of the first encapsulant.

In an embodiment, a surface of the first electronic component is flush with at least one of the first surface and the second surface of the first encapsulant. In another embodiment, a surface of the first electronic component is flush with the first surface or the second surface of the first encapsulant.

In an embodiment, the first circuit structure is free from being electrically connected to the first electronic component.

In an embodiment, the second electronic component is disposed on the second circuit structure through a plurality of second conductive elements. In another embodiment, an underfill is formed between the second circuit structure and the second electronic component for encapsulating the second conductive elements.

In an embodiment, a second encapsulant is formed on the second circuit structure for encapsulating the second electronic component.

In an embodiment, the first electronic component is electrically connected to the second circuit structure through a plurality of conductors.

In an embodiment, before the second electronic component is disposed on the second circuit structure, a packaging substrate is disposed on the first conductive elements.

According to the present disclosure, since the first electronic component and the second electronic component are arranged on upper and lower sides of the second circuit structure, respectively, the electronic package can provide multi-function and high efficiency.

DETAILED DESCRIPTION OF THE EMBODIMENTS

The following illustrative embodiments are provided to illustrate the disclosure of the present disclosure, these and other advantages and effects can be apparent to those in the art after reading this specification.

It should be noted that all the drawings are not intended to limit the present disclosure. Various modifications and variations can be made without departing from the spirit of the present disclosure. Further, terms such as "first", "second", "on", "a" etc. are merely for illustrative purposes and should not be construed to limit the scope of the present disclosure.

FIGS. 2A to 2F are schematic cross-sectional views showing a method for fabricating an electronic package 2 according to a first embodiment of the present disclosure.

Figure 2A:
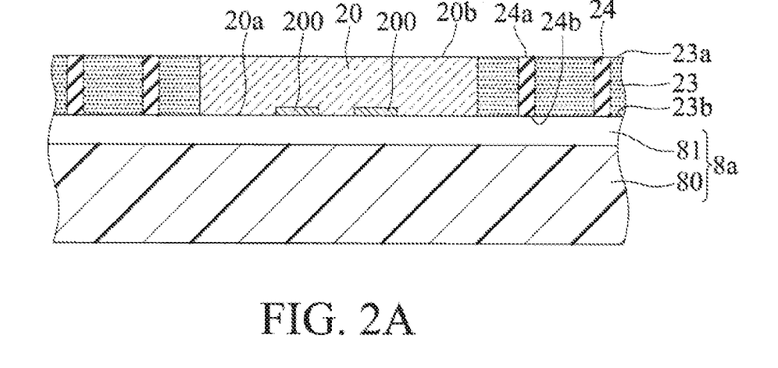
FIGS. 2A to 2F are schematic cross-sectional views showing a method for fabricating an electronic package according to a first embodiment of the present disclosure.

Referring to FIG. 2A, a first carrier 8a is provided, a plurality of conductive posts 24 are disposed on the first carrier 8a, and at least a first electronic component 20 is disposed on the first carrier 8a. Then, a first encapsulant 23 is formed on the first carrier 8a to encapsulate the conductive posts 24 and the first electronic component 20, such that the conductive posts 24 and the first electronic component 20 are embedded in the encapsulant 23.

In an embodiment, the first carrier 8a includes a plate 80 made of, for example, a semiconductor material, a dielectric material, ceramic, glass or metal. In another embodiment, the first carrier 8a can be a wafer or full-panel type substrate according to the practical need. In yet another embodiment, the first carrier 8a further includes a bonding layer 81 made of, for example, a release film or an adhesive. The bonding layer 81 is formed on the plate 80 by coating or attachment.

The first electronic component 20 is an active element, such as a semiconductor chip, a passive element, such as a resistor, a capacitor or an inductor, or a combination thereof. In an embodiment, the first electronic component 20 is a semiconductor chip having an active surface 20a with a plurality of electrode pads 200 disposed thereon and an inactive surface 20b opposite to the active surface 20a. The first electronic component 20 is bonded to the bonding layer 81 though the active surface 20a thereof.

The first encapsulant 23 has a first surface 23a and a second surface 23b opposite to the first surface 23a. Each of the conductive posts 24 has a first end 24a exposed from the first surface 23a of the first encapsulant 23 and a second end 24b opposite to the first end 24a and bonded to the bonding layer 81 of the first carrier 8a. In an embodiment, the first encapsulant 23 is made of an insulating material, such as polyimide, a dry film, an epoxy resin or a molding compound. In another embodiment, the first encapsulant 23 is formed on the bonding layer 81 through injection, lamination or molding.

Further, a leveling process is performed to cause the inactive surface 20b of the first electronic component 20 and the first ends 24a of the conductive posts 24 to be flush with the first surface 23a of the first encapsulant 23. In an embodiment, a portion of the conductive posts 24, the first electronic component 20 and the first encapsulant 23 is removed by grinding.

Figure 2B:
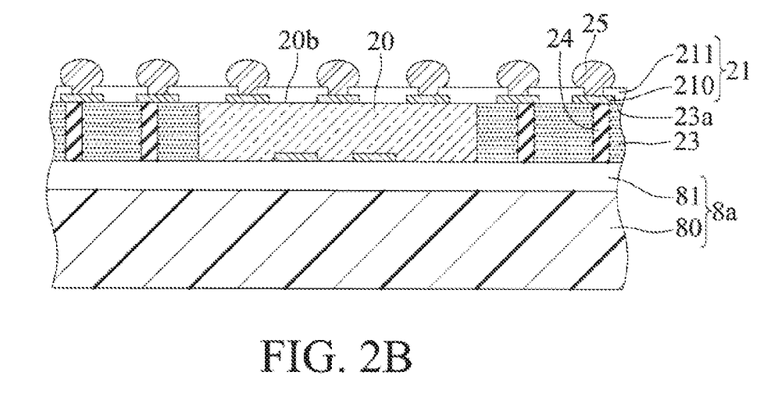

Referring to FIG. 2B, a first circuit structure 21 is disposed on the first surface 23a of the first encapsulant 23 and the inactive surface 20b of the first electronic component 20 and electrically connected to the conductive posts 24. In an embodiment, a plurality of first conductive elements 25 are disposed on the first circuit structure 21.

In an embodiment, the first circuit structure 21 has at least a first redistribution layer 210 electrically connected to the first ends 24a of the conductive posts 24. In another embodiment, the first redistribution layer 210 is made of copper.

Further, the first circuit structure 21 has at least an insulating layer (not shown). In an embodiment, the insulating layer is made of a dielectric material, such as polybenzoxazole (PBO), polyimide or prepreg. A plurality of first redistribution layers 210 can be formed in the insulating layer. Furthermore, the first circuit structure 21 has an insulating layer 211, such as a solder mask layer, and the first conductive elements 25 are exposed from the insulating layer 211.

In an embodiment, the first redistribution layer 210 is in contact with but not electrically connected to the inactive surface 20b of the first electronic component 20.

In an embodiment, the first conductive elements 25 are made of a solder material, copper or other conductive material. The first conductive elements 25 are electrically connected to the first redistribution layer 210.

Figure 2C:
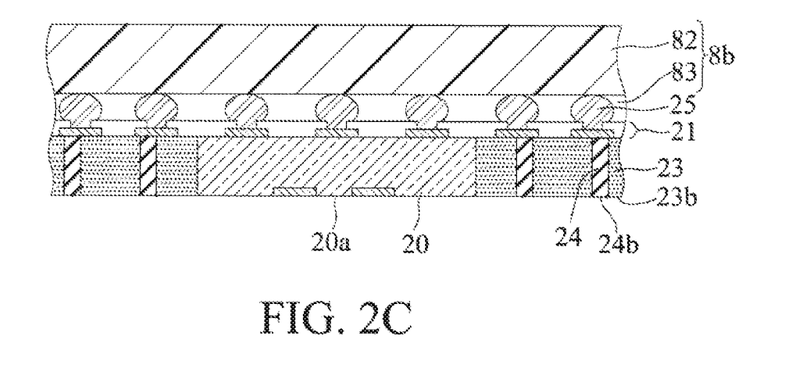

Referring to FIG. 2C, a second carrier 8b is disposed on the first circuit structure 21. Then, the first carrier 8a is removed to expose the second surface 23b of the first encapsulant 23, the second ends 24b of the conductive posts 24 and the active surface 20a of the first electronic component 20.

In an embodiment, the second carrier 8b includes a plate 82 made of, for example, a semiconductor material, a dielectric material, ceramic, glass or metal. In another embodiment, the second carrier 8b can be a wafer or full-panel type substrate according to the practical need.

The second carrier 8b further includes a bonding layer 83 made of, for example, a release film or an adhesive. The bonding layer 83 is formed on the plate 82 by coating or attachment and laminated on the first circuit structure 21. As such, the first conductive elements 25 are embedded in the bonding layer 83.

Further, the active surface 20a of the first electronic component 20 and the second ends 24b of the conductive posts 24 are flush with the second surface 23b of the first encapsulant 23.

Figure 2D:
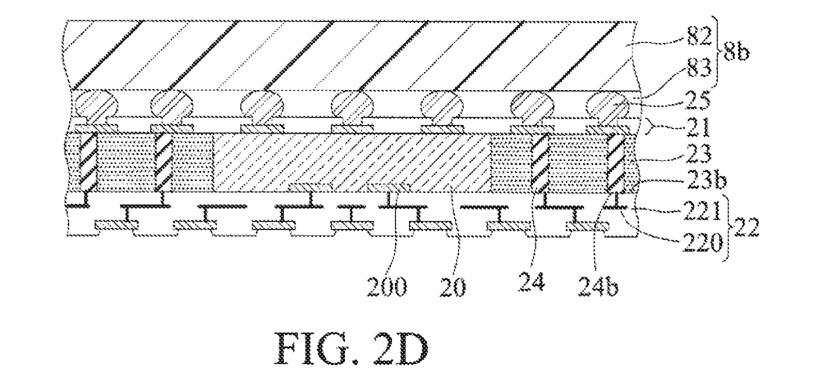

Referring to FIG. 2D, an RDL (redistribution layer) process is performed to form a second circuit structure 22 on the second surface 23b of the first encapsulant 23. The second circuit structure 22 is electrically connected to the electrode pads 200 of the first electronic component 20 and the second ends 24b of the conductive posts 24.

In an embodiment, the second circuit structure 22 has at least an insulating layer 221 and at least a second redistribution layer 220 formed on the second insulating layer 221. The outermost one of the at least a second insulating layer 221 can serve as a solder mask layer, and the outermost one of the at least a second redistribution layer 220 is exposed from the solder mask layer.

In an embodiment, the second redistribution layer 220 is made of copper, and the second insulating layer 221 is made of a dielectric material, such as PBO, polyimide or prepreg.

Figure 2E:
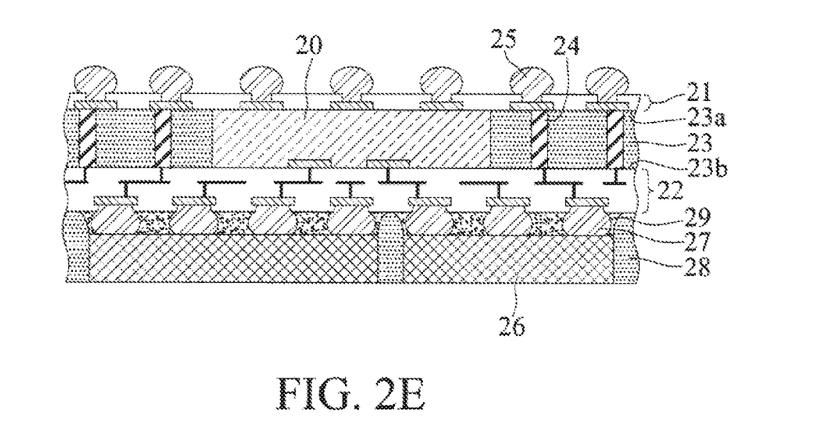

Referring to FIG. 2E, at least a second electronic component 26 is disposed on the second circuit structure 22 and a second encapsulant 28 is formed to encapsulate the second electronic component 26. Then, the second carrier 8b is removed to expose the first conductive elements 25.

In an embodiment, the second electronic component 26 is an active element, such as a semiconductor chip, a passive element, such as a resistor, a capacitor or an inductor, or a combination thereof. In an embodiment, the second electronic component 26 is a semiconductor chip, such as a graphics processing unit (GPU) or a high bandwidth memory (HBM).

Further, the second electronic component 26 is electrically connected to the second redistribution layer 220 through a plurality of second conductive elements 27, such as solder bumps or copper bumps. Both the second electronic component 26 and the second conductive elements 27 are encapsulated by the second encapsulant 28.

In an embodiment, the second encapsulant 28 is made of an insulating material, such as polyimide, a dry film, an epoxy resin or a molding compound. The second encapsulant 28 is formed on the second circuit structure 22 through lamination or molding. It should be noted that the second encapsulant 28 can be made of a material that is the same as or different from that of the first encapsulant 23.

In an embodiment, an underfill 29 is formed between the second electronic component 26 and the second circuit structure 22 to encapsulate the second conductive elements 27, and then the second encapsulant 28 is formed to encapsulate the underfill 29 and the second electronic component 26.

Figure 2F:
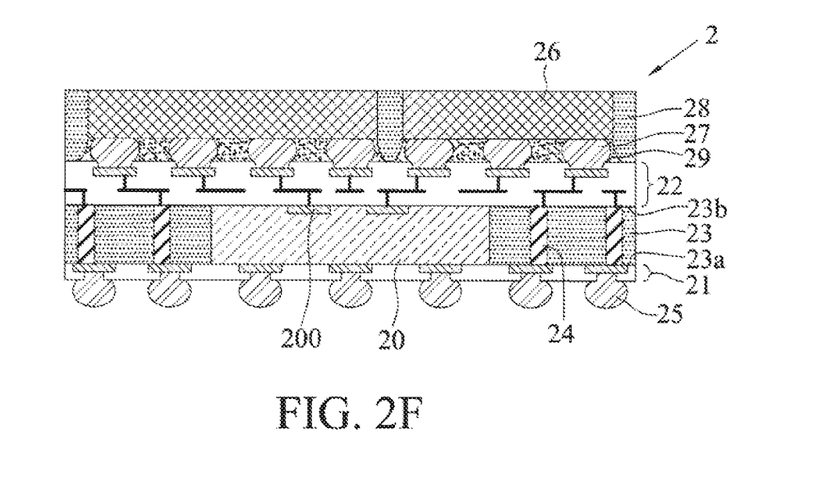

Referring to FIG. 2F, a singulation process is performed to obtain an electronic package 2. Subsequently, the electronic package 2 can be disposed on a circuit board (not shown) through the first conductive elements 25.

According to the present disclosure, since the first electronic component 20 and the second electronic component 26 are arranged on upper and lower sides of the second circuit structure 22, respectively, the electronic package 2 can provide multi-function and high efficiency.

FIGS. 3A to 3D are schematic cross-sectional views showing a method for fabricating an electronic package 3 according to a second embodiment of the present disclosure. The second embodiment differs from the first embodiment in the fabrication order of the first circuit structure and the first conductive elements.

Figure 3A:
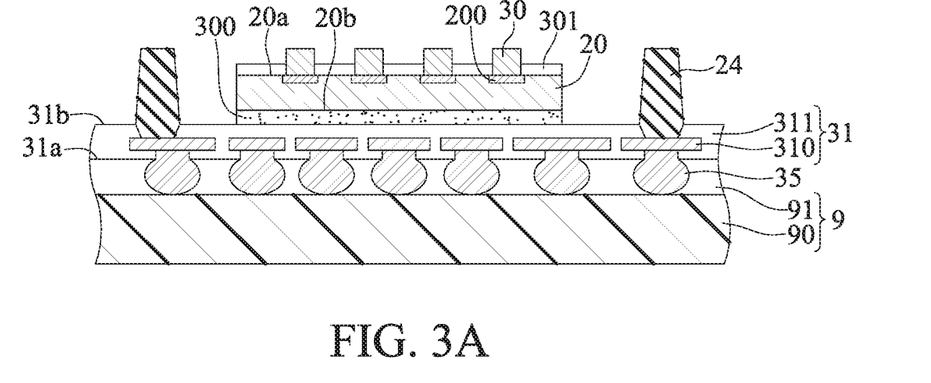
FIGS. 3A to 3D are schematic cross-sectional views showing a method for fabricating an electronic package according to a second embodiment of the present disclosure, wherein FIG. 3A' is a schematic cross-sectional view showing a pre-process of FIG. 3A.

As shown in FIG. 3A', a first circuit structure 31 is formed on a carrying board (not shown) first, and a plurality of first conductive elements 35 are disposed on the other side of the first circuit structure 31 that is not in contact with the carrying board. Then, the first circuit structure 31 is flipped over, the first circuit structure 31 and the first conductive elements 35 are combined on a carrier 9, and the carrying board is removed. The first circuit structure 31 has a first side 31a and a second side 31b opposite to the first side 31a. A plurality of first conductive elements 35 are disposed on the first side 31a of the first circuit structure 31 and bonded to the carrier 9. Then, as shown in FIG. 3A, a plurality of conductive posts 24 are disposed on the second side 31b of the first circuit structure 31 and electrically connected to the first circuit structure 31, and a first electronic component 20 is disposed on the second side 31b of the first circuit structure 31.

In an embodiment, the first circuit structure 31 has at least a first insulating layer 311 and a first redistribution layer 310 formed on the first insulating layer 311. In an embodiment, the first redistribution layer 310 is made of copper and the first insulating layer 311 is made of a dielectric material, such as PBO, polyimide or prepreg.

The carrier 9 includes a plate 90 made of, for example, a semiconductor material, a dielectric material, ceramic, glass or metal. In an embodiment, the carrier 9 can be a wafer or full-panel type substrate according to the practical need. In an embodiment, the carrier 9 further includes a bonding layer 91 made of, for example, a release film or an adhesive. The bonding layer 91 is formed on the plate 90 by coating or attachment and the first circuit structure 31 is laminated on the bonding layer 91. As such, the first conductive elements 35 are embedded in the bonding layer 91.

The conductive posts 24 are disposed on and electrically connected to the first redistribution layer 310. The conductive posts 24 are made of a metal material, such as copper or a solder material.

Further, the first electronic component 20 is attached to the second side 31b of the first circuit structure 31 through an adhesive layer 300. A protection film 301, such as a passivation film, is formed on the active surface 20a of the first electronic component 20, and a plurality of electrode pads 200 of the active surface 20a are exposed from the protection film 301. Furthermore, a plurality of conductors 30 are formed on and electrically connected to the electrode pads 200 of the first electronic component 20 and protrude from the protection film 301. In an embodiment, each of the conductors 30 has a ball shape, such as a solder ball, a post shape, such as a copper post or a solder bump, or a stud shape formed by a wire bonder.

Figure 3B:
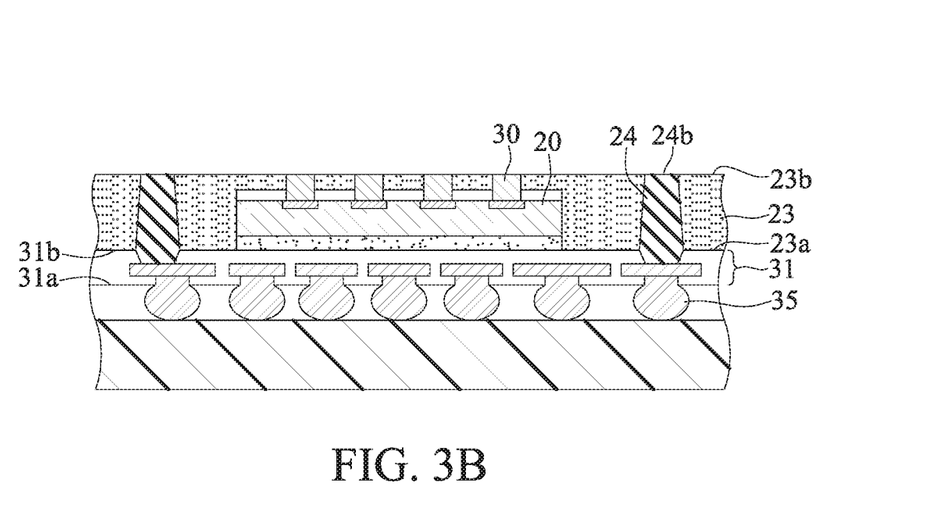

Referring to FIG. 3B, a first encapsulant 23 is formed on the second side 31b of the first circuit structure 31 to encapsulate the first electronic component 20, the conductors 30 and the conductive posts 24, such that the first electronic component 20, the conductors 30 and the conductive posts 24 are embedded in the first encapsulant 23. In an embodiment, the first circuit structure 31 and the first conductive elements 35 are formed prior to the embedding of the first electronic component 20 and the conductive posts 24. Then, a leveling process is performed to cause the second surface 23b of the first encapsulant 23 to be flush with the second ends 24b of the conductive posts 24 and the end surfaces of the conductors 30, thus exposing the second ends 24b of the conductive posts 24 and the end surfaces of the conductors 30 from the first encapsulant 23.

In an embodiment, the first encapsulant 23 is made of an insulating material, such as an epoxy resin. The first encapsulant 23 is formed on the second side 31b of the first circuit structure 31 through lamination or molding.

Further, during the leveling process, a portion of the conductive posts 24, the conductors 30 and the first encapsulant 23 is removed by grinding.

Figure 3C:
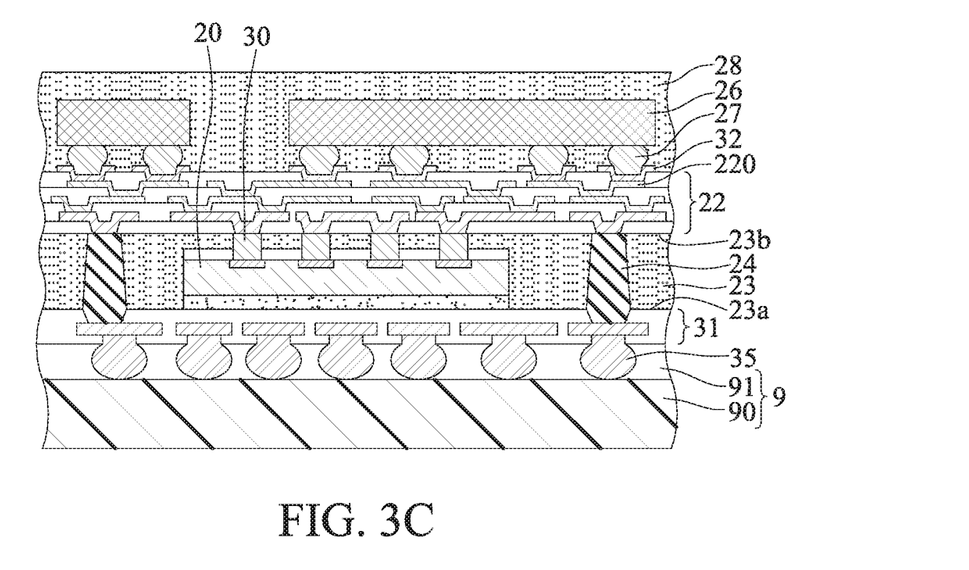

Referring to FIG. 3C, a second circuit structure 22 is disposed on the second surface 23b of the first encapsulant 23 and electrically connected to the conductive posts 24 and the conductors 30. Then, at least a second electronic component 26 is disposed on the second circuit structure 22 through a plurality of second conductive elements 27, such as solder balls, and a second encapsulant 28 is formed to encapsulate the second electronic component 26 and the second conductive elements 27.

In an embodiment, a UMB (under bump metallurgy) layer 32 is formed on the outermost second redistribution layer 220 to facilitate the bonding between the second redistribution layer 220 and the conductive elements 27.

In an embodiment, an underfill 29 of the first embodiment can be formed between the second electronic component 26 and the second circuit structure 22 to encapsulate the second conductive elements 27 and then the second encapsulant 28 is formed to encapsulate the underfill 29 and the second electronic component 26.

Figure 3D:
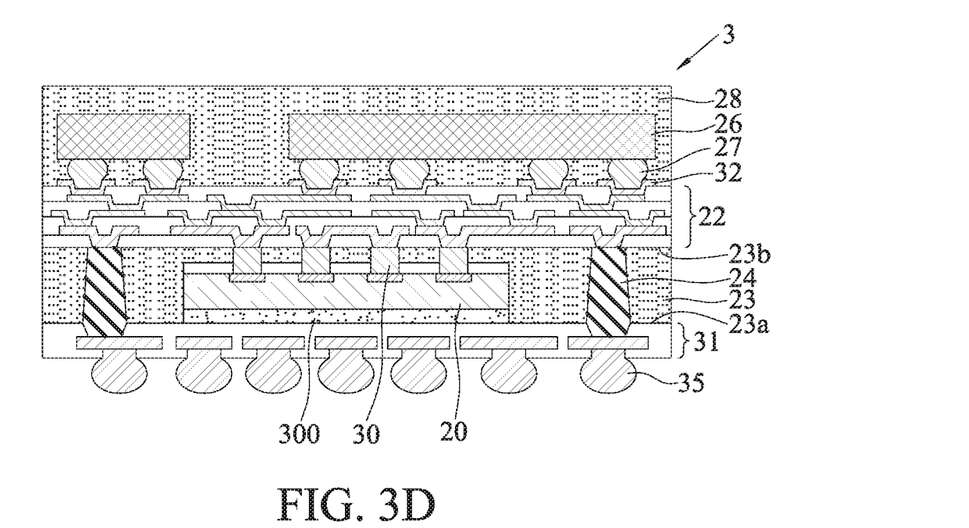

Referring to FIG. 3D, the carrier 9 is removed to expose the first conductive elements 35. Then, a singulation process is performed to obtain an electronic package 3. Subsequently, the electronic package 3 can be disposed on a circuit board (not shown) through the first conductive elements 35 thereof.

As shown in FIGS. 3A to 3D, the first circuit structure 31 and the first conductive elements 35 are formed, and the second circuit structure 22 is formed so as for the second electronic component 26 to be disposed thereon. Therefore, the first electronic component 20 and the second electronic component 26 are arranged on the upper and lower sides of the second circuit structure 22, respectively. As such, the electronic package 3 can provide multi-function and high efficiency.

FIGS. 4A to 4D are schematic cross-sectional views showing a method for fabricating an electronic package 4 according to a third embodiment of the present disclosure. The third embodiment differs from the second embodiment in the process of a packaging substrate.

Figure 4A:
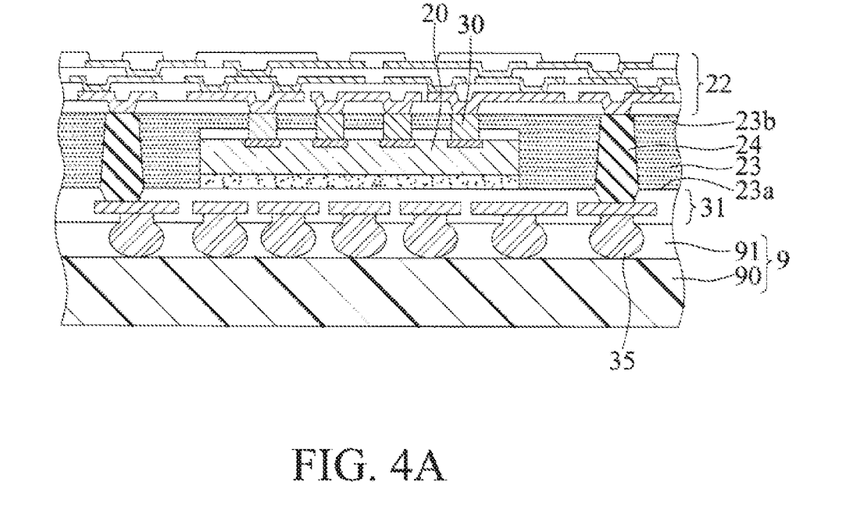
FIGS. 4A to 4D are schematic cross-sectional views showing a method for fabricating an electronic package according to a third embodiment of the present disclosure.

Referring to FIG. 4A, continued from FIG. 3B, a second circuit structure 22 is disposed on the second surface 23b of the first encapsulant 23 and electrically connected to the conductive posts 24 and the conductors 30.

Figure 4B:
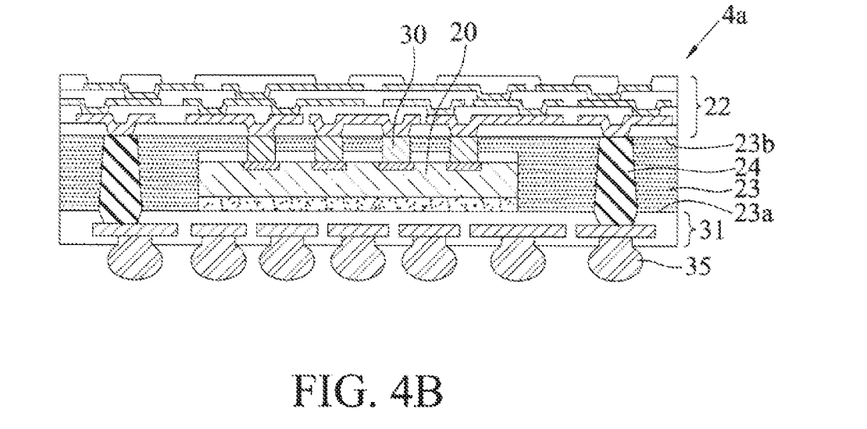

Referring to FIG. 4B, the carrier 9 is removed to expose the first conductive elements 35, and a singulation process is performed to obtain a package structure 4a.

Figure 4C:
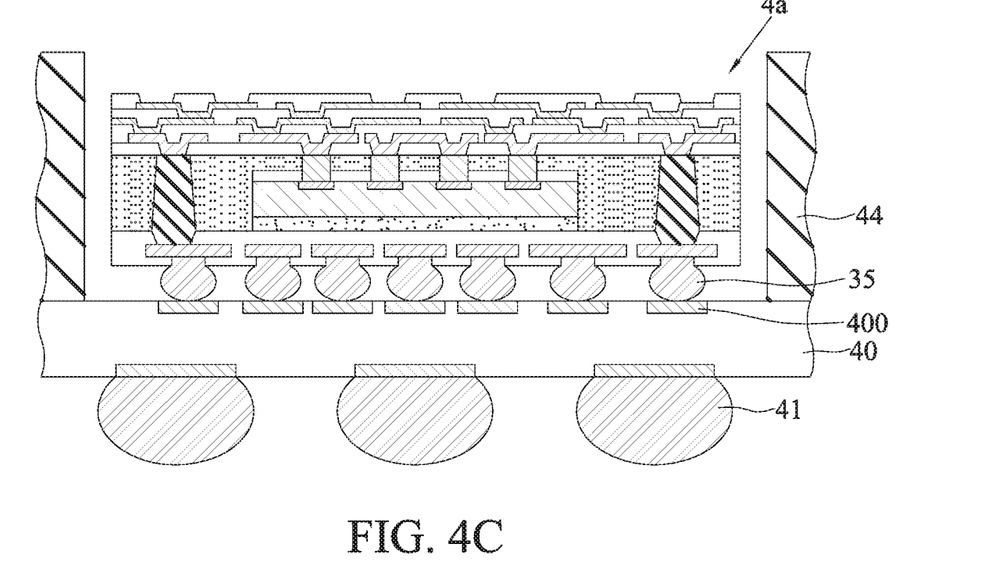

Referring to FIG. 4C, the package structure 4a is disposed on a packaging substrate 40 through the first conductive elements 35.

In an embodiment, the packaging substrate 40 has on an upper side thereof a plurality of conductive pads 400 bonded to the first conductive elements 35, and a plurality of solder balls 41 are planted on a lower side of the packaging substrate 40 during a ball planting process.

Further, a strengthening element 44, such as a metal frame, can be disposed on the packaging substrate 40 so as to avoid stress concentration and prevent the packaging substrate 40 from warping.

Figure 4D:
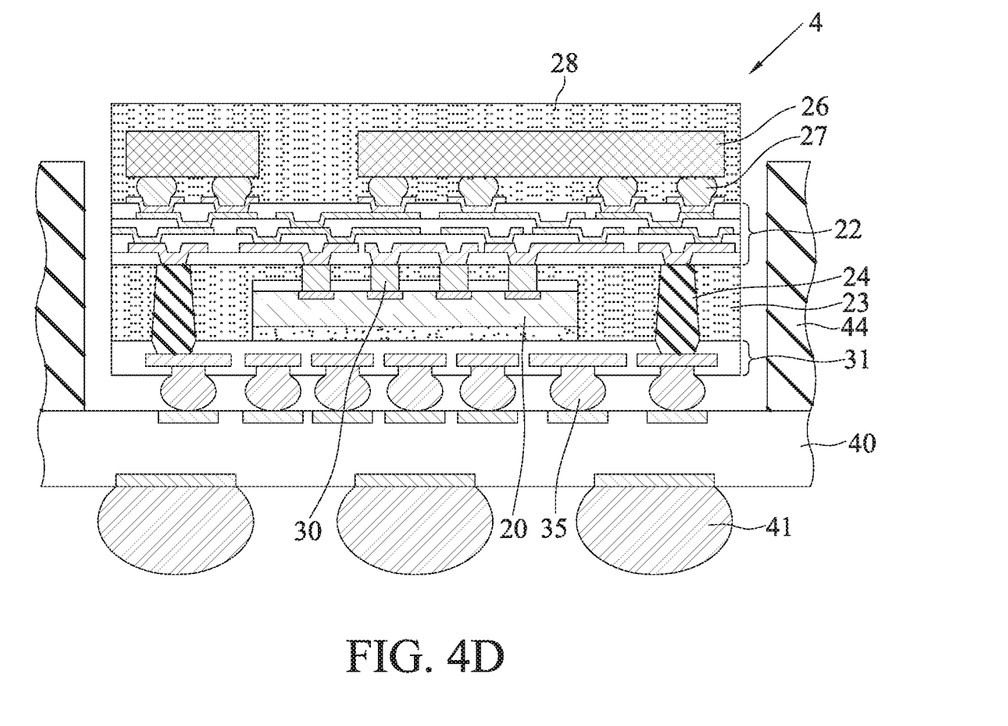

Referring to FIG. 4D, at least a second electronic component 26 is disposed on the second circuit structure 22 through a plurality of second conductive elements 27 and a second encapsulant 28 is formed to encapsulate the second electronic component 26. As such, an electronic package 4 is obtained. Subsequently, the electronic package 4 can be disposed on a circuit board (not shown) through the solder balls 41 on the lower side of the packaging substrate 40.

In an embodiment, an underfill 29 of the first embodiment can be formed between the second electronic component 26 and the second circuit structure 22 to encapsulate the second conductive elements 27 and then the second encapsulant 28 is formed to encapsulate the underfill 29 and the second electronic component 26.

As shown in FIGS. 4A to 4D, the first circuit structure 31 and the first conductive elements 35 are formed so as for the packaging substrate 40 to be disposed thereon, and the second circuit structure 22 is formed so as for the second electronic component 26 to be disposed thereon. Therefore, the first electronic component 20 and the second electronic component 26 are arranged on the upper and lower sides of the second circuit structure 22, respectively. As such, the electronic package 4 can provide multi-function and high efficiency.

The present disclosure further provides an electronic package 2, 3, 4, which has: a first encapsulant 23 having a first surface 23a and a second surface 23b opposite to the first surface 23a; at least a first electronic component 20 embedded in the first encapsulant 23; a plurality of conductive posts 24 embedded in the first encapsulant 23; a first circuit structure 21, 31 disposed on the first surface 23a of the first encapsulant 23 and electrically connected to the conductive posts 24; a plurality of first conductive elements 25, 35 disposed on the first circuit structure 21, 31; a second circuit structure 22 disposed on the second surface 23b of the first encapsulant 23 and electrically connected to the conductive posts 24 and the first electronic component 20; and at least a second electronic component 26 disposed on and electrically connected to the second circuit structure 22.

In an embodiment, each of the conductive posts 24 has a first end 24a and a second end 24b opposite to the first end 24a, and surfaces of the first ends 24a of the conductive posts 24 are flush with the first surface 23a of the first encapsulant 23, or surfaces of the second ends 24b of the conductive posts 24 are flush with the second surface 23b of the first encapsulant 23.

In an embodiment, the first electronic component 20 has an active surface 20a and an inactive surface 20b opposite to the active surface 20a. The active surface 20a of the first electronic component 20 is flush with the first surface 23a of the first encapsulant 23, or the inactive surface 20b of the first electronic component 20 is flush with the second surface 23b of the first encapsulant 23.

In an embodiment, the first circuit structure 21, 31 is electrically connected to the first conductive elements 25, 35.

In an embodiment, the first circuit structure 21, 31 is free from being electrically connected to the first electronic component 20.

In an embodiment, the first electronic component 20 is electrically connected to the second circuit structure 22 through a plurality of conductors 30.

In an embodiment, the second electronic component 26 is disposed on the second circuit structure 22 through a plurality of second conductive elements 27.

In an embodiment, the electronic package 2, 3, 4 further has a second encapsulant 28 formed on the second circuit structure 22 for encapsulating the second electronic component 26.

In one embodiment, the electronic package 4 further has a packaging substrate 40 disposed on the first conductive elements 35.

According to the present disclosure, since the first electronic component and the second electronic component are arranged on the upper and lower sides of the second circuit structure, respectively, the electronic package can provide multi-function and high efficiency.

The above-described descriptions of the detailed embodiments are only to illustrate the preferred implementation according to the present disclosure, and it is not to limit the scope of the present disclosure. Accordingly, all modifications and variations completed by those with ordinary skill in the art should fall within the scope of present disclosure defined by the appended claims.

What is claimed is:

1. A method for fabricating an electronic package, comprising:
   providing a first encapsulant having a first surface and a second surface opposite to the first surface and embedding a first electronic component and a plurality of conductive posts in the first encapsulant;
   disposing a first circuit structure on the first surface of the first encapsulant and electrically connecting the first circuit structure to the conductive posts;
   disposing a plurality of first conductive elements on the first circuit structure;
   disposing a second circuit structure on the second surface of the first encapsulant and electrically connecting the second circuit structure to the conductive posts and the first electronic component; and
   disposing a second electronic component on the second circuit structure and electrically connecting the second electronic component to the second circuit structure.

2. The method of claim 1, wherein the conductive posts have end surfaces flush with at least one of the first surface and the second surface of the first encapsulant.

3. The method of claim 1, wherein the first electronic component has a surface flush with at least one of the first surface and the second surface of the first encapsulant.

4. The method of claim 1, further comprising forming on the second circuit structure a second encapsulant encapsulating the second electronic component.

5. The method of claim 1, wherein the first circuit structure is free from being electrically connected to the first electronic component.

6. The method of claim 1, wherein the second electronic component is disposed on the second circuit structure through a plurality of second conductive elements.

7. The method of claim 6, further comprising forming between the second circuit structure and the second electronic component an underfill encapsulating the second conductive elements.

8. The method of claim 1, further comprising disposing on the first electronic component a plurality of conductors electrically connecting the first electronic component to the second circuit structure.

9. The method of claim 1, further comprising, prior to disposing the second electronic component on the second circuit structure, disposing a packaging substrate on the first conductive elements.

* * * * *